United States Patent
Lyons et al.

(10) Patent No.: US 6,423,475 B1
(45) Date of Patent: Jul. 23, 2002

(54) SIDEWALL FORMATION FOR SIDEWALL PATTERNING OF SUB 100 NM STRUCTURES

(75) Inventors: Christopher F. Lyons, Fremont; Michael K. Templeton, Atherton; Kathleen R. Early, Santa Clara, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/266,367

(22) Filed: Mar. 11, 1999

(51) Int. Cl.$^7$ .................. G03C 5/00; H01L 21/31; H01L 21/461
(52) U.S. Cl. ............ 430/314; 430/313; 430/316; 430/317; 430/318
(58) Field of Search ............... 430/314, 317, 430/318, 723, 313, 316; 438/639, 724; 216/74, 78; 427/585

(56) References Cited

U.S. PATENT DOCUMENTS

| | | | |
|---|---|---|---|
| 4,502,914 A | * 3/1985 | Trumpp et al. | 438/424 |
| 4,803,181 A | * 2/1989 | Buchmann et al. | 438/696 |
| 5,595,941 A | 1/1997 | Okamoto et al. | 437/228 |
| 5,665,203 A | 9/1997 | Lee et al. | 438/585 |
| 5,705,321 A | 1/1998 | Brueck et al. | 430/316 |
| 5,710,066 A | 1/1998 | Okamoto et al. | 437/228 |
| 5,714,039 A | 2/1998 | Beilstein, Jr. et al. | 156/657.1 |
| 5,895,740 A | * 4/1999 | Chien et al. | 430/313 |
| 6,291,137 B1 | * 9/2001 | Lyons et al. | 430/313 |

* cited by examiner

Primary Examiner—Mark F. Huff
Assistant Examiner—Saleha R. Mohamedulla
(74) Attorney, Agent, or Firm—Renner, Otto, Boisselle & Sklar, LLP

(57) ABSTRACT

In one embodiment, the present invention relates to a method of forming a conductive structure having a width of about 100 nm or less, involving the steps of providing a substrate having a conductive film; patterning a photoresist over a first portion of the conductive film wherein a second portion of the conductive film is exposed, the photoresist having at least one sidewall over the conductive film; depositing a sidewall film over the conductive film and the photoresist, the sidewall film having a vertical portion adjacent the sidewall of the photoresist and a horizontal portion in areas not adjacent the sidewall of the photoresist; removing the horizontal portion of the sidewall film exposing a third portion of the conductive film; removing the photoresist exposing a fourth portion of the conductive film; and etching the third portion and the fourth portion of the conductive film thereby providing the conductive structure having a width of about 100 nm or less underlying the vertical portion of the sidewall film.

20 Claims, 2 Drawing Sheets

SIDEWALL FORMATION FOR SIDEWALL PATTERNING OF SUB 100 NM STRUCTURES

TECHNICAL FIELD

The present invention generally relates to making sub-lithographic structures using sidewall patterning techniques. In particular, the present invention relates to sub 100 nm conductive structures using sidewall patterning techniques.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photo-lithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. Patterning conductive features including metal lines and silicon substances (such as amorphous silicon and polysilicon) with small dimensions is required in order to participate in the continuing trend toward higher device densities. Procedures that increase resolution, improved critical dimension control, and provide small conductive features are therefore desired.

SUMMARY OF THE INVENTION

The present invention provides methods of forming sub-lithographic features. The present invention also provides sub-lithographic conductive features that are particularly useful for forming metal lines, gate conductors and interconnects. As a result, the present invention effectively addresses the concerns raised by the trend towards the miniaturization of semiconductor devices.

In one embodiment, the present invention relates to a method of forming a conductive structure having a width of about 100 nm or less, involving the steps of providing a substrate having a conductive film; patterning a photoresist over a first portion of the conductive film wherein a second portion of the conductive film is exposed, the photoresist having at least one sidewall over the conductive film; depositing a sidewall film over the conductive film and the photoresist, the sidewall film having a vertical portion adjacent the sidewall of the photoresist and a horizontal portion in areas not adjacent the sidewall of the photoresist; removing the horizontal portion of the sidewall film exposing a third portion of the conductive film; removing the photoresist exposing a fourth portion of the conductive film; and etching the third portion and the fourth portion of the conductive film thereby providing the conductive structure having a width of about 100 nm or less underlying the vertical portion of the sidewall film. In some embodiments, it may be desirable to thermally stabilize the photoresist before depositing the sidewall film.

In another embodiment, the present invention relates to a method of forming a polysilicon structure, involving the steps of providing a substrate having a polysilicon film; patterning a photoresist over a first portion of the polysilicon film wherein a second portion of the polysilicon film is exposed, the photoresist having at least one sidewall over the polysilicon film; depositing a silicon containing sidewall film over the polysilicon film and the photoresist, the silicon containing sidewall film having a vertical portion adjacent the sidewall of the photoresist and a horizontal portion in areas not adjacent the sidewall of the photoresist, the silicon containing sidewall film having a thickness from about 100 Å to about 2,000 Å; removing the horizontal portion of the silicon containing sidewall film exposing a third portion of the polysilicon film; removing the photoresist exposing a fourth portion of the polysilicon film; and etching the third portion and the fourth portion of the polysilicon film thereby providing the polysilicon structure having a width of about 100 nm or less underlying the vertical portion of the silicon containing sidewall film.

In yet another embodiment, the present invention relates to a method of forming a thin metal line, involving the steps of providing a substrate having a metal layer thereon; patterning a photoresist over a first portion of the metal layer wherein a second portion of the metal layer is exposed, the photoresist having at least one sidewall over the metal layer; depositing a silicon containing sidewall film by plasma enhanced chemical vapor deposition over the metal layer and the photoresist, the silicon containing sidewall film having a vertical portion adjacent the sidewall of the photoresist and a horizontal portion in areas not adjacent the sidewall of the photoresist, the silicon containing sidewall film having a thickness from about 100 Å to about 2,000 Å; removing the horizontal portion of the silicon containing sidewall film exposing a third portion of the metal layer; removing the photoresist exposing a fourth portion of the metal layer; and etching the third portion and the fourth portion of the metal layer thereby providing the thin metal line having a width of about 100 nm or less underlying the vertical portion of the silicon containing sidewall film.

DISCLOSURE OF INVENTION

Figure 1:
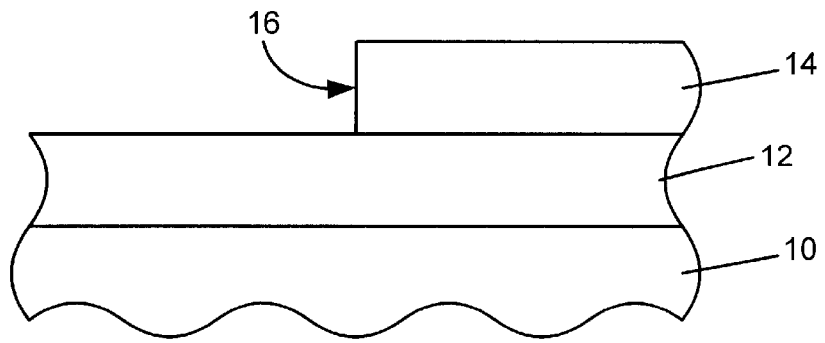
FIG. 1 illustrates in a cross-sectional view the methods of forming a sublithographic structure according to several aspects of the present invention.

The present invention involves making sub-lithographic structures by sidewall patterning of semiconductor materials. The present invention more specifically involves methods of forming sub-lithographic features in a simple and efficient manner.

A conductive film is provided over a substrate. The substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc. The conductive film is provided over a portion of the substrate or over the entire substrate.

The conductive film contains a material that conducts or semiconducts electrical current. Conductive films include metal layers and silicon layers, such as polysilicon and amorphous silicon. Metal layers include layers of a single metal as well as metal alloy layers containing two or more metals. Specific examples of metal layers include aluminum, copper, gold, nickel, palladium, platinum, silver, tantalum, titanium, tungsten, zinc, aluminum-copper alloys, aluminum alloys, copper alloys, titanium alloys, tungsten alloys, titanium-tungsten alloys, gold alloys, nickel alloys, palladium alloys, platinum alloys, silver alloys, tantalum alloys, zinc alloys, metal silicides, and any other alloys thereof.

The conductive film may be formed in any suitable manner. The thickness of the conductive film is typically from about 300 Å to about 3,000 Å. In another embodiment, the thickness of the conductive film is from about 500 Å to about 2,500 Å. In another embodiment, the thickness of the conductive film is from about 750 Å to about 2,000 Å.

A photoresist is provided over a portion of the conductive film wherein portions of the conductive film are exposed. The photoresist is provided over a portion of the conductive film or over the entire conductive film and processed (exposed and developed) so that the photoresist has at least one sidewall substantially perpendicular to the substrate surface. In most embodiments, the photoresist has two or more sidewalls substantially perpendicular to the substrate surface. The photoresist contains an organic material that may be formed into a pattern. Any organic photoresist may be applied to the conductive film by any suitable means, such as spin coating. For example, a 157 nm sensitive photoresist, a 193 nm sensitive photoresist, an I-line, H-line, G-line, deep UV, extreme UV or chemically amplified photoresist material may be spin-coated on the conductive film. Positive or negative photoresists may be used. Photoresists are commercially available from a number of sources, including Shipley Company, Kodak, Hoechst Celanese Corporation, Brewer and IBM.

The thickness of the photoresist is selected so that a vertical portion of the sidewall film (described later) is large enough to effectively act as a mask for etching of the conductive film. In one embodiment, the photoresist has a thickness from about 500 Å to about 10,000 Å. In another embodiment, the photoresist has a thickness from about 1,000 Å to about 5,000 Å. In yet another embodiment, the photoresist has a thickness from about 1,500 Å to about 3,000 Å. In a preferred embodiment, the photoresist contains a deep UV or extreme UV photoresist material. Deep UV and extreme UV photoresist materials can be easily deposited and developed at thicknesses from about 500 Å to about 10,000 Å, and particularly from about 1,500 Å to about 3,000 Å.

In an optional embodiment, depending on the temperature requirements for formation of the sidewall film, the photoresist pattern may be thermally stabilized prior to sidewall film formation using known techniques, such as deep UV/thermal stabilization, photostabilization and/or deep UV curing. In one embodiment, the photoresist pattern is thermally stabilized prior to sidewall film deposition using plasma enhanced chemical vapor deposition (PECVD) techniques when the photoresist is a deep UV photoresist.

A sidewall film is deposited over all or a portion of the conductive film partially covered by the patterned photoresist. In a preferred embodiment, the sidewall film is deposited over the entire substrate. The sidewall film conforms to the profile of the conductive film partially covered by the patterned photoresist; that is, the sidewall film is formed in a substantially uniform thickness over the conductive film or patterned photoresist.

The sidewall film is selected so that there is etch selectivity between the conductive film, the photoresist and the sidewall film. For conductive films of metal layers and silicon layers, sidewall films of a silicon containing film are employed. Silicon containing films include one or more of silicon oxide, silicon oxynitride and silicon nitride.

The sidewall film may be made in any suitable manner, including chemical vapor deposition (CVD) techniques. CVD techniques include low pressure chemical vapor deposition (LPCVD) and PECVD. In one embodiment, a silicon nitride film may be made by PECVD or LPCVD employing gases containing silicon and nitrogen, such as using $SiH_4$ or $SiCl_2H_2$ and $N_2$ or $NH_3$. In another embodiment, a silicon oxide film may be made by PECVD or LPCVD employing gases containing silicon and oxygen, such as using $SiH_4$ or $SiCl_2H_2$ and $N_2O$ or $O_2$. In yet another embodiment, a silicon oxynitride film may be made by PECVD or LPCVD employing gases containing silicon, oxygen and nitrogen, such as using $SiH_4$ and $N_2O$ and $NH_3$. PECVD techniques are preferred since, generally speaking, lower processing temperatures are associated therewith. As a result of lower deposition temperatures, the photoresist material is not damaged or degraded by deposition of the sidewall film.

In embodiments where the conductive film is a metal, such as those listed above including aluminum, copper, titanium and tungsten, the sidewall film is preferably silicon oxide or silicon nitride, although silicon oxynitride may be employed as the sidewall film. In embodiments where the conductive film is a silicon layer such as polysilicon or amorphous silicon, the sidewall film is preferably silicon nitride or silicon oxynitride, although silicon oxide may be employed as the sidewall film.

The thickness of the sidewall film is selected depending upon the desired width of the resultant sub-lithographic conductive structure. In one embodiment, the sidewall film has a thickness from about 100 Å to about 2,000 Å. In another embodiment, the sidewall film has a thickness from about 200 Å to about 1,500 Å. In yet another embodiment, the sidewall film has a thickness from about 300 Å to about 1,000 Å. In one embodiment, the thickness of the sidewall film is substantially uniform around the conductive film and patterned photoresist in that the thickness does not vary by more than about 50 Å comparing the thickest and thinnest areas of the sidewall film.

For purposes of this invention, there are two main portions of the sidewall film. The first is a portion of the sidewall film adjacent the sidewall(s) of the sidewall template and is referred to herein as the vertical portion. The second is a portion of the sidewall film that covers the flat surfaces (parallel or substantially parallel to the plane of the flat surface of the substrate) of the sidewall template and the conductive film and is referred to herein as the horizontal portion(s).

A directional etch is performed to remove portions of the sidewall film covering the flat surfaces of the patterned photoresist and conductive film (the horizontal portions as defined above) while not substantially removing the vertical portion of the sidewall film adjacent the sidewalls of the patterned photoresist. Dry etching techniques may be employed. In a preferred embodiment, a dry anisotropic etch process is employed whereby the horizontal portions of the sidewall film are removed. In one embodiment, a RIE technique is employed. In a preferred embodiment, dry etch techniques are used. The specific etchant depends upon the specific identity of the sidewall film material. Dry etch techniques typically involve using a plasma containing one or more fluorine compounds, such as one of $NF_3$, $SF_6$, $CH_3F$, $C_4F_8$, $CF_4$ and $CHF_3$. The etch technique is selected so that the photoresist and conductive film are not etched significantly etched or degraded. In this connection, the photoresist and conductive film act as etch stop layers when performing the directional etch of the sidewall film.

While the directional etch removes the horizontal portions of the sidewall film, a small amount of the vertical portion of the sidewall film may be also removed. However, in most instances, the small amount of the vertical portion removed substantially corresponds with the thickness of the sidewall film thus leaving a vertical portion of the sidewall film (having a height) equal to or slightly less than the height of the thickness of the photoresist). Typically, the height of the vertical portion of the sidewall film is slightly less (from about 1% to about 20% less based upon the height of the step) than the height of the photoresist. All or substantially all (from about 80% to about 99% of the original height) of the vertical portion of the sidewall film remains positioned adjacent the patterned photoresist.

After directional etch of the horizontal portions of the sidewall film, the photoresist is removed or stripped. Dry or wet etching techniques may be employed. In a one embodiment, a wet etch process using an aqueous stripper is employed to remove the photoresist. In one embodiment, a dry RIE technique using $O_2$ is employed. In a preferred embodiment, wet etch techniques are used. The specific etchant depends upon the specific identity of the photoresist material. Dry etch techniques typically involve using a plasma containing at least $O_2$. The etch technique is selected so that the vertical portion of the sidewall film and the conductive film are not etched significantly etched or degraded. In this connection, the conductive film acts an as etch stop layer when performing the directional etch of the photoresist.

The exposed portions of the conductive film are etched in a directional manner wherein the remaining vertical portion of the sidewall film acts as a mask for conductive film located underneath it. In one embodiment, the exposed portions of the conductive film are etched using an anisotropic etching process. In another preferred embodiment, a RIE is employed. Dry or wet etching techniques may be employed. In a preferred embodiment, dry etch techniques are used. The specific etchant depends upon the specific identity of the conductive film material. Dry etch techniques typically involve using a plasma containing one or more of a fluorine compound, a chlorine compound, and a bromine compound, such as one or more of $BCl_3$, $CCl_4$, $SiCl_4$, $Cl_2$, $NF_3$, $SF_6$, $CH_3F$, $CF_4$, $CHF_3$ and HBr. The technique is selected so that the vertical portion of the sidewall film or the underlying substrate is not etched or significantly etched or degraded.

Generally speaking, the etch techniques for the directional etch of the horizontal portions of the sidewall film, the removal of the photoresist (if etch techniques are used) and the etch of the conductive film are selected so that at least about 2:1 etch selectivity is achieved between the one material and the other material(s). In a preferred embodiment, the etch techniques for the directional etch of the horizontal portions of the sidewall film, the removal of the photoresist (if etch techniques are used) and the etch of the conductive film are selected so that at least about 3:1 etch selectivity is achieved between the one material and the other material(s). In a more preferred embodiment, the etch techniques for the directional etch of the horizontal portions of the sidewall film, the removal of the photoresist (if etch techniques are used) and the etch of the conductive film are selected so that at least about 5:1 etch selectivity is achieved between the one material and the other material(s).

Remaining on the substrate is one or more lines (depending upon the shape of the patterning of the photoresist) of the conductive film underneath the vertical portions of the sidewall film constituting a sub-lithographic structure or feature. Alternatively, the remaining vertical portion of the sidewall film may be stripped or removed leaving a sub-lithographic structure or feature made of the conductive film material.

The dimensions of the conductive film portion of the resulting sub-lithographic feature depend primarily upon the specific identity of the sidewall film material and the thickness of the sidewall film. The dimensions of the conductive film portion of the resulting sub-lithographic feature may be from about 100 Å to about 2,000 Å in width and from about 300 Å to about 3,000 Å in height. In another embodiment, the dimensions of the conductive film portion of the resulting sub-lithographic feature may be from about 200 Å to about 1,500 Å in width and from about 500 Å to about 2,500 Å in height. In yet another embodiment, the dimensions of the conductive film portion of the resulting sub-lithographic feature may be from about 300 Å to about 1,000 Å in width and from about 750 Å to about 2,000 Å in height.

The resulting sub-lithographic feature made in accordance with the present invention may be useful for subsequent processing of the substrate on which it is positioned. For example, the sub-lithographic feature made in accordance with the present invention may be used for forming a gate conductor (in embodiments where the conductive film contains silicon), for forming thin metal lines, and for forming metal patterns.

One embodiment of the methods of the present invention is now described in connection with the Figures. Referring to FIG. 1, a substrate 10 is provided with a conductive film 12 over a portion of the substrate 10. Although not shown, the substrate 10 may include any suitable semiconductor material (one or more layers of semiconductor materials), for example, a monocrystalline silicon substrate. Also, although not shown, the substrate 10 may include one or more layers including substrate layers, diffusion regions, dielectric layers such as oxides, devices, polysilicon layers, and the like.

The conductive film 12 may be deposited over the entire substrate 10 and patterned to cover a desired portion of the substrate 10 using, for instance, photolithography and etching techniques. In this embodiment, the conductive film 12 comprises polysilicon. The thickness of the polysilicon conductive film 12 is about 2,000 Å. A deep UV photoresist 14 is deposited and patterned over the polysilicon conductive film 12 using suitable photolithography techniques so that it partially covers the polysilicon conductive film 12, wherein a portion of the conductive film 12 is exposed (not underneath the deep UV photoresist 14). The deep UV photoresist 14 is patterned in such a manner that there is at least one sidewall 16 in the deep UV photoresist 14 over the substrate. The thickness of the deep UV photoresist 14 is about 3,000 Å. Optionally, the deep UV photoresist pattern 14 is thermally stabilized prior to sidewall film formation using deep UV stabilization techniques.

Figure 2:
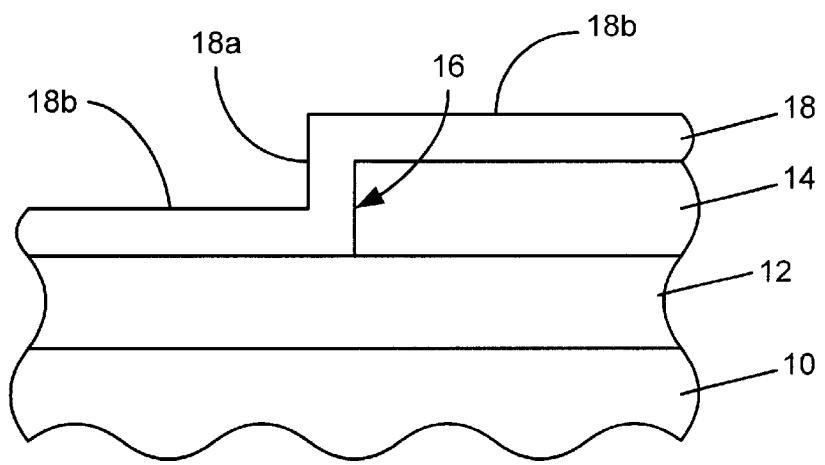
FIG. 2 illustrates in a cross-sectional view the methods of forming a sub-lithographic structure according to several aspects of the present invention.

Referring to FIG. 2, a sidewall film 18 is deposited over the polysilicon conductive film 12 and deep UV photoresist 14 in a suitable manner. In this embodiment, a silicon oxynitride layer is deposited by PECVD techniques and the thickness of the silicon oxynitride sidewall film 18 is about 750 Å. The thickness of the sidewall film 18 is substantially uniform on the polysilicon conductive film 12 and the deep UV photoresist 14. There are two portions of the silicon oxynitride sidewall film 18; namely, a portion 18a adjacent the sidewall 16 of the deep UV photoresist 14 and portions 18b covering the flat surfaces of the conductive film 12 and the deep UV photoresist 14.

Figure 3:
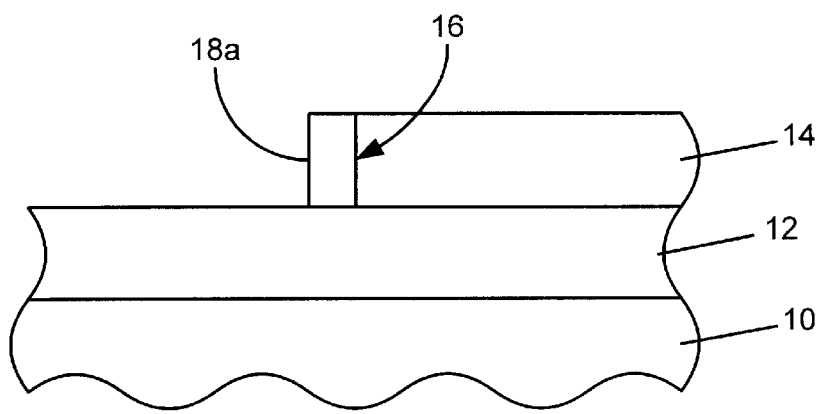
FIG. 3 illustrates in a cross-sectional view the methods of forming a sub-lithographic structure according to several aspects of the present invention.

Referring to FIG. 3, a directional etch is performed removing portions of the sidewall film covering the flat surfaces of the polysilicon conductive film 12 and deep UV photoresist 14. In this embodiment, an anisotropic dry etch using $C_4F_8$ is performed for a time sufficient to remove the portions 18b of the sidewall film 18 over the flat surfaces of the conductive film 12 and the deep UV photoresist 14, but not so long as to remove substantial portion 18a of the sidewall film 18 adjacent the sidewall 16 of the deep UV photoresist 14.

Figure 4:
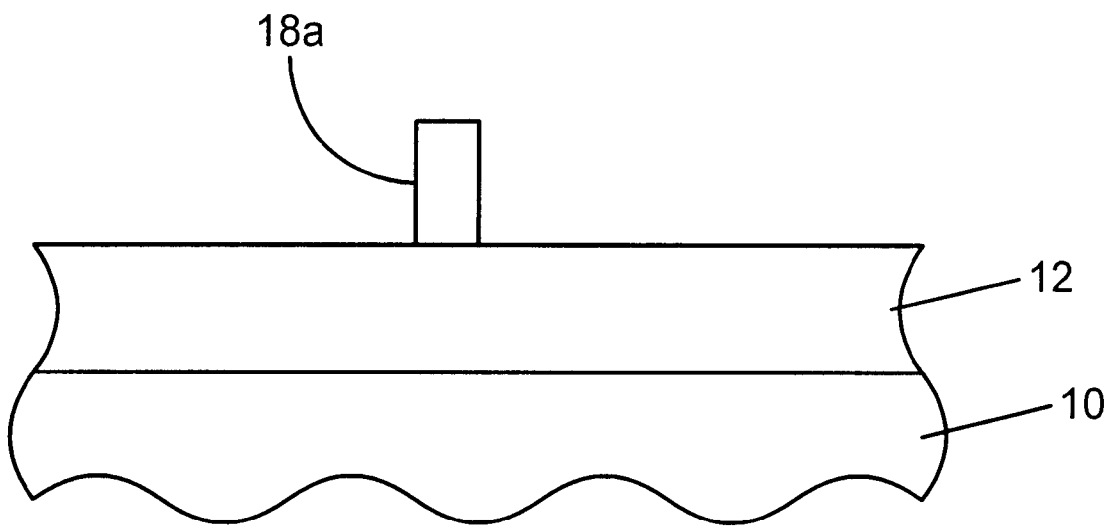
FIG. 4 illustrates in a cross-sectional view the methods of forming a sub-lithographic structure according to several aspects of the present invention.

Referring to FIG. 4, the deep UV photoresist 14 is stripped or removed without substantially damaging or removing the remaining portion 18a of the silicon oxynitride sidewall film 18. In this embodiment, a wet etching technique using an aqueous stripper is employed. The conductive film 12 is exposed except for portions underneath the silicon oxynitride sidewall film portion 18a.

Figure 5:
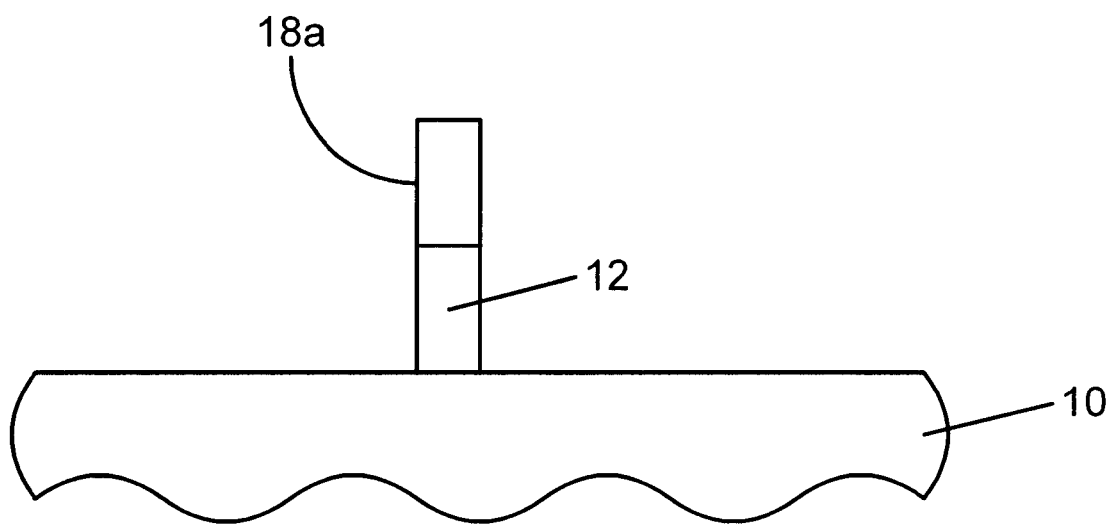
FIG. 5 illustrates in a cross-sectional view the methods of forming a sub-lithographic structure according to several aspects of the present invention.

Referring to FIG. 5, a directional etch is performed removing exposed portions of the conductive film 12 (not underneath the sidewall film portion 18a) by suitable means. For example, a selective etch technique is used to remove the polysilicon conductive film 12 employing an anisotropic dry etch leaving patterned remaining portion 18a of the silicon oxynitride sidewall film 18. The remaining sidewall film portion 18a serves as a mask to prevent etching or removal of the remaining portion of the polysilicon conductive film 12 therebeneath during the directional etch. In this embodiment, a dry etch technique including a bromine compound and a chlorocompound, such as using $Cl_2$ and HBr, is employed. The etch technique has selectivity in that the size of the remaining portion 18a of the silicon oxynitride sidewall film 18 is not substantially reduced, although reductions in size may be tolerated.

In this embodiment, the height and width of patterned remaining polysilicon conductive film 12 beneath the remaining portion 18a is about 2,000 Å and about 750 Å. The patterned remaining polysilicon conductive film 12 may be used in making gate conductors. The patterned remaining polysilicon conductive film 12 is particulary useful for forming narrow gate conductors which enables the production of semiconductor devices having high densities.

Another embodiment of the methods of the present invention is now described in connection with the Figures. Referring again to FIG. 1, a substrate 10 is provided with a conductive film 12 over a portion of the substrate 10. Although not shown, the substrate 10 may include any suitable semiconductor material (one or more layers of semiconductor materials), for example, a monocrystalline silicon substrate. Also, although not shown, the substrate 10 may include one or more layers including substrate layers, diffusion regions, dielectric layers such as oxides, devices, polysilicon layers, and the like.

The conductive film 12 may be deposited over the entire substrate 10 and patterned to cover a desired portion of the substrate 10 using, for instance, photolithography and etching techniques. In this embodiment, the conductive film 12 comprises an aluminum-copper alloy. The thickness of the aluminum-copper alloy conductive film 12 is about 1,500 Å. An I-line photoresist 14 is deposited and patterned over the aluminum-copper alloy conductive film 12 using suitable photolithography techniques so that it partially covers the aluminum-copper alloy conductive film 12, wherein a portion of the conductive film 12 is exposed (not underneath the I-line photoresist 14). The I-line photoresist 14 is patterned in such a manner that there is at least one sidewall 16 in the I-line photoresist 14 over the substrate. The thickness of the I-line photoresist 14 is about 2,500 Å. Optionally, the I-line photoresist pattern 14 is thermally stabilized prior to sidewall film formation using thermal stabilization techniques.

Referring to FIG. 2, a sidewall film 18 is deposited over the aluminum-copper alloy conductive film 12 and the I-line photoresist 14 in a suitable manner. In this embodiment, a silicon nitride layer is deposited by PECVD techniques and the thickness of the silicon nitride sidewall film 18 is about 400 Å. The thickness of the silicon nitride sidewall film 18 is substantially uniform on the aluminum-copper alloy conductive film 12 and the I-line photoresist 14. There are two portions of the silicon nitride sidewall film 18; namely, a portion 18a adjacent the sidewall 16 of the I-line photoresist 14 and portions 18b covering the flat surfaces of the conductive film 12 and the I-line photoresist 14.

Referring to FIG. 3, a directional etch is performed removing portions of the sidewall film covering the flat surfaces of the aluminum-copper alloy conductive film 12 and the I-line photoresist 14. In this embodiment, an anisotropic dry etch using $NF_3$ is performed for a time sufficient to remove the portions 18b of the silicon nitride sidewall film 18 over the flat surfaces of the aluminum-copper alloy conductive film 12 and the I-line photoresist 14, but not so long as to remove substantial portions 18a of the silicon nitride sidewall film 18 adjacent the sidewall 16 of the I-line photoresist 14.

Referring to FIG. 4, the I-line photoresist 14 is stripped or removed without substantially damaging or removing the remaining portion 18a of the silicon nitride sidewall film 18. In this embodiment, a dry etching technique using oxygen containing plasmas, such as $O_2$, is employed. The conductive film 12 is exposed except for portions underneath the silicon nitride sidewall film portion 18a.

Referring to FIG. 5, a directional etch is performed removing exposed portions of the aluminum-copper alloy conductive film 12 (not underneath the sidewall film portion 18a) by suitable means. For example, a selective etch technique is used to remove the aluminum-copper alloy conductive film 12 employing an anisotropic dry etch leaving patterned remaining portion 18a of the silicon nitride sidewall film 18. The remaining portion 18a serves as a mask to prevent etching of the remaining portion of the aluminum-copper alloy conductive film 12 therebeneath during the directional etch. In this embodiment, a dry etch technique including at least one chlorocompound, such as using $Cl_2$ and $BCl_3$, is employed. The etch technique has selectivity in that the size of the remaining portion 18a of the silicon nitride sidewall film 18 is not substantially reduced, although reductions in size may be tolerated.

In this embodiment, the height and width of patterned remaining aluminum-copper alloy conductive film 12 beneath the remaining portion 18a is about 1,500 Å and about 400 Å. The patterned remaining aluminum-copper alloy conductive film 12 may be used in making interconnect lines, particulary narrow interconnect lines which enables the production of semiconductor devices having high densities.

Although the invention has been shown and described with respect to a certain a preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a conductive structure having a width of about 100 nm or less, comprising:
   providing a substrate having a conductive film;
   patterning a photoresist over a first portion of the conductive film wherein a second portion of the conductive film is exposed, the photoresist having at least one sidewall over the conductive film;
   depositing a sidewall film over the conductive film and the photoresist, the sidewall film having a vertical portion adjacent the sidewall of the photoresist and a horizontal portion in areas not adjacent the sidewall of the photoresist;
   removing the horizontal portion of the sidewall film exposing a third portion of the conductive film, the third portion being at least a part of the second portion;
   removing the photoresist exposing a fourth portion of the conductive film, the fourth portion being at least a part of the first portion; and
   etching the third portion and the fourth portion of the conductive film thereby providing the conductive structure having a width of about 100 nm or less underlying the vertical portion of the sidewall film.

2. The method of claim 1, wherein the conductive film comprises one of polysilicon, amorphous silicon, aluminum, copper, gold, nickel, palladium, platinum, silver, tantalum, titanium, tungsten, zinc, an aluminum-copper alloy, an aluminum alloy, a copper alloy, a titanium alloy, a tungsten alloy, a titanium-tungsten alloy, a gold alloy, a nickel alloy, a palladium alloy, a platinum alloy, a silver alloy, a tantalum alloy, and a zinc alloy.

3. The method of claim 1, wherein the conductive film has a thickness from about 500 Å to about 3,000 Å.

4. The method of claim 1, wherein the photoresist has a thickness from about 500 Å to about 10,000 Å.

5. The method of claim 1, wherein the photoresist comprises at least one of a 157 nm sensitive photoresist material, a 193 nm sensitive photoresist material, an I-line photoresist material, H-line photoresist material, G-line photoresist material, E-line photoresist material, a deep UV photoresist material, an extreme UV photoresist material, and chemically amplified photoresist material.

6. The method of claim 1, wherein the sidewall film comprises at least one of silicon nitride, silicon oxide, and silicon oxynitride.

7. The method of claim 1, wherein the horizontal portion of the sidewall film is removed using an anisotropic etching technique.

8. A method of forming a polysilicon structure, comprising:
   providing a substrate having a polysilicon film;
   patterning a photoresist over a first portion of the polysilicon film wherein a second portion of the polysilicon film is exposed, the photoresist having at least one sidewall over the polysilicon film;
   depositing a silicon containing sidewall film over the polysilicon film and the photoresist, the silicon containing sidewall film having a vertical portion adjacent the sidewall of the photoresist and a horizontal portion in areas not adjacent the sidewall of the photoresist, the silicon containing sidewall film having a thickness from about 100 Å to about 2,000 Å;
   removing the horizontal portion of the silicon containing sidewall film exposing a third portion of the polysilicon film, the third portion being at least a part of the second portion;
   removing the photoresist exposing a fourth portion of the polysilicon film, the fourth portion being at least a part of the first portion; and
   etching the third portion and the fourth portion of the polysilicon film thereby providing the polysilicon structure having a width of about 100 nm or less underlying the vertical portion of the silicon containing sidewall film.

9. The method of claim 8, wherein the photoresist comprises at least one of 157 nm sensitive photoresist material, a 193 nm sensitive photoresist material, an I-line photoresist material, H-line photoresist material, G-line photoresist material, E-line photoresist material, a deep UV photoresist material, an extreme UV photoresist material, and chemically amplified photoresist material.

10. The method of claim 8, wherein the silicon containing sidewall film has a thickness from about 200 Å to about 1,500 Å.

11. The method of claim 8, wherein the silicon containing sidewall film comprises at least one of silicon nitride, silicon oxide and silicon oxynitride.

12. The method of claim 8, wherein the silicon containing sidewall film is deposited by plasma enhanced chemical vapor deposition.

13. The method of claim 8, further comprising processing the polysilicon structure into a polysilicon gate conductor.

14. The method of claim 8, wherein the polysilicon structure has a thickness of about 3,000 Å or less and a width of about 1,000 Å or less.

15. A method of forming a thin metal line, comprising:

providing a substrate having a metal layer thereon;

patterning a photoresist over a first portion of the metal layer wherein a second portion of the metal layer is exposed, the photoresist having at least one sidewall over the metal layer;

depositing a silicon containing sidewall film by plasma enhanced chemical vapor deposition over the metal layer and the photoresist, the silicon containing sidewall film having a vertical portion adjacent the sidewall of the photoresist and a horizontal portion in areas not adjacent the sidewall of the photoresist, the silicon containing sidewall film having a thickness from about 100 Å to about 2,000 Å;

removing the horizontal portion of the silicon containing sidewall film exposing a third portion of the metal layer, the third portion being at least a part of the second portion;

removing the photoresist exposing a fourth portion of the metal layer the fourth portion being at least a part of the first portion; and etching the third portion and the fourth portion of the metal layer thereby providing the thin metal line having a width of about 100 nm or less underlying the vertical portion of the silicon containing sidewall film.

16. The method of claim 15, wherein the metal layer has a thickness from about 500 Å to about 3,000 Å and comprises at least one of aluminum, copper, gold, nickel, palladium, platinum, silver, tantalum, titanium, tungsten, zinc, an aluminum-copper alloy, an aluminum alloy, a copper alloy, a titanium alloy, a tungsten alloy, a titanium-tungsten alloy, a gold alloy, a nickel alloy, a palladium alloy, a platinum alloy, a silver alloy, a tantalum alloy, and a zinc alloy.

17. The method of claim 15, wherein the silicon containing film comprises one of silicon nitride, silicon oxide, and silicon oxynitride.

18. The method of claim 15, wherein the photoresist comprises at least one of a 157 nm sensitive photoresist material, a 193 nm sensitive photoresist material, an I-line photoresist material, H-line photoresist material, G-line photoresist material, E-line photoresist material, a deep UV photoresist material, an extreme UV photoresist material, and chemically amplified photoresist material.

19. The method of claim 15, wherein directionally etching the silicon containing film involves using a dry anisotropic etch technique.

20. The method of claim 15, wherein the thin metal line has a thickness of about 2,700 Å or less and a width of about 1,000 Å or less.

* * * * *